United States Patent [19]

Kearns

[11] Patent Number: 4,531,066

[45] Date of Patent: Jul. 23, 1985

[54] VARIABLE BIAS LOGIC CIRCUIT

[76] Inventor: Robert W. Kearns, 9725 Lookout Pl., Gaithersburg, Md. 20760

[21] Appl. No.: 961,051

[22] Filed: Nov. 15, 1978

Related U.S. Application Data

[63] Continuation of Ser. No. 498,895, Aug. 20, 1974, , which is a continuation of Ser. No. 418,967, Nov. 26, 1973, , which is a continuation of Ser. No. 229,954, Feb. 28, 1972, , which is a continuation of Ser. No. 56,131, Jul. 6, 1970, , which is a continuation of Ser. No. 612,526, Jan. 30, 1967.

[51] Int. Cl.³ .................... H03K 19/20; H03K 19/123
[52] U.S. Cl. ................................... 307/445; 307/464; 307/465
[58] Field of Search ............... 307/311, 202, 215, 218, 307/445, 464

[56] References Cited

U.S. PATENT DOCUMENTS 2,603,746  7/1952  Burhart et al. ..................... 328/93

OTHER PUBLICATIONS

"A Survey of Semiconductor Devices and Circuit Computers" by V. Marsocci, Semiconductor Products, 1/61.

Primary Examiner—Stanley D. Miller
Assistant Examiner—B. P. Davis
Attorney, Agent, or Firm—Lane, Aitken & Kananen

[57] ABSTRACT

In a logic circuit, a transistor performs the function of a binary switching device and is controlled by the currents applied to the base thereof through differently weighted resistors. The resistors are connected to inputs to which signals representing different binary variables can be applied. The base of the transistor is also connected to a source of voltage through a variable resistor. By varying the value of the variable resistor, the logical function performed by the gate can be varied.

13 Claims, 8 Drawing Figures

−1 → 0          ALWAYS ON

0 → +1          A+B

+1 → +2       A

+2 → +3       A·B

VARIABLE BIAS LOGIC CIRCUIT

CROSS-REFERENCE TO RELATED APPLICATIONS

This application is a continuation of application Ser. No. 498,895 filed Aug. 20, 1974, which in turn is a continuation of application Ser. No. 418,967 filed Nov. 26, 1973, which in turn is a continuation of application Ser. No. 229,954 filed Feb. 28, 1972, which in turn is a continuation of application Ser. No. 56,131 filed July 6, 1970, which in turn is a continuation of application Ser. No. 612,526 filed Jan. 30, 1967.

The invention relates to logic circuits and refers more specifically to means for and a method of implementing a plurality of logic functions with a single logic circuit having a variable bias.

Logic functions and circuits for implementing logic functions are well known. Distinct logic functions of the past have usually been implemented by distinct logic circuits, such as the well known AND, OR and NOT circuits or combinations thereof.

With such logic circuits it has not been physically practical to implement many desirable logic functions. Thus the number of single logic circuits soon becomes prohibitive in regard to cost, time, physical number and electrical characteristics when attempting to implement even rather simple logic functions or statements with the known logic circuits, such as the AND, OR and NOT circuits.

In addition implementing logic functions with a plurality of logic circuits, such as AND, OR and NOT circuits requires a supply of different quantities of each of the basic logic circuits which are difficult to schedule for production. Further such implementation of logic functions requires the maintenance of a supply of a plurality of separate logic circuits for service parts which is again undesirable.

Even though digital circuits have profited from progress in microcircuit manufacturing techniques, two basic problems still remain. The first is the unreliability of such circuits due to the "tyranny-of-numbers." This is exemplified by the fact that the yield in manufacturing is low since if one component in the microcircuit is faulty the entire circuit must be discarded. The second problem is that the power dissipated by the complete circuit is not reduced merely by reducing its size. In fact, temperature problems are increased since the same amount of power must now be dissipated in a smaller volume.

It is therefore one of the objects of the present invention to provide an improved means for and method of implementing logic functions.

Another object is to provide an improved logic circuit.

Another object is to provide a single logic circuit capable of implementing a plurality of distinct logic functions.

Another object is to provide a single variable bias logic circuit capable of implementing a number of distinct logic circuits.

Another object is to provide a method of implementing a number of distinct logic functions with the single logic circuit set forth above comprising the step of varying the bias of the single logic circuit.

Another object is to provide variable bias logic circuits as set forth above which may be combined to implement complex logic functions.

Another object is to provide a method of implementing complex logic functions with the single logic circuits set forth above comprising the step of combining a plurality of single logic circuits.

Another object is to provide a single logic circuit which will allow the construction of complex systems with a reduced component count and consequent greater freedom of design, reliability, relatively fast switching systems with moderate speed components and low power consumption.

Another object is to provide an improved logic circuit and method of implementing logic functions which is simple, economical and efficient.

These and other objects will become more apparent, especially when the specification is considered in conjunction with the accompanying drawings, wherein.

With particular reference to the figures of the drawings, one embodiment of the present invention will now be considered in detail.

Figure 3:
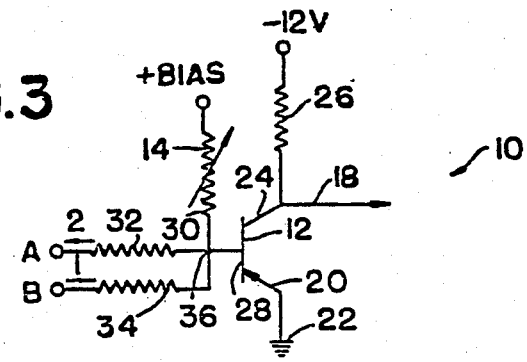
FIG. 3 is a schematic diagram of a two variable, variable bias logic circuit constructed in accordance with the invention.

As shown in FIG. 3, the variable bias logic circuit 10 includes a single transistor 12 having an emitter 20 connected to electronic common 22, a collector 24 connected to a source of negative electric energy and a base 28. A bias circuit 14 is connected to the base 28. The bias circuit 14 includes the variable bias resistor 30 connected to a source of positive bias current and the resistors 32 and 34 connected to the logic variables A and B, as shown. The logic variables A and B are electric circuits such that when variable A is present by itself, two units of current are drawn from junction 36 and when variable B is present by itself, one unit of current is drawn from junction 36. With both variables present three units of current are drawn and with neither variable present no current is drawn from junction 36.

In operation of the variable bias logic circuit 10 the bias applied to the transistor 12 through the variable bias resistor 30 is varied to produce an output on conductor 18 indicating different logic functions in accordance with the presence or not of the logic variables A and B. Thus different logic functions may be implemented by the single logic circuit of FIG. 3 by merely changing the bias applied to the transistor 12.

As indicated above logic circuits are well known. Similarly the usual logic circuit building blocks, such as the usual AND, OR and NOT circuits and the function maps which may be drawn for these basic circuits, as for example the OR map of FIG. 1 and the AND map of FIG. 2 for the logic variables A and B are well known. In this regard reference is made to "The Map Method for Synthesis of Combinational Logic Circuits", by M. Karnaugh in the Transactions of the American Institute of Electrical Engineers, Communications and Electronics, Volume 72, Pages 593 to 599, November, 1953. Such logic circuits and function maps will not therefore be considered in detail herein.

Figure 1:
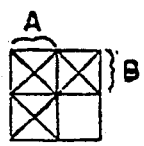
FIGS. 1 and 2 are two variable, logic maps for the logic functions, A or B, and A and B respectively.
Figure 2:
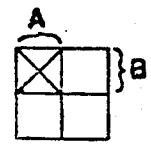

It is desired to point out at this time however that with two logic variables the logic map for A or B and for A and B will be as illustrated in FIGS. 1 and 2 respectively. With prior known logic circuits both the function map of FIG. 1 and the function map of FIG. 2 would require a separate circuit to implement.

Thus, it will be seen that with prior logic circuits inventory problems can readily arise. In other words, it would be much more convenient both for service inventory purposes and production if a single logic circuit capable of selectively implementing a plurality of logic functions were available. Such a logic circuit is provided in accordance with the invention.

The variable bias logic circuit 10 of the invention, as previously indicated, includes the transistor 12 having the emitter 20 connected to electronic common 22 as shown and the collector 24 connected to a source of electric energy, such as a negative twelve volt electric energy source as shown, through the collector resistor 26. An output is taken between the conductor 18 and electronic common 22.

The base 28 of the transistor 12 is connected through the variable resistor 30 in the bias circuit 14 to a source of positive electric bias energy, as shown. The base 28 of the transistor 12 is additionally connected through the separate resistors 32 and 34 to logic variables A and B respectively. The logic variables A and B may be sources of electric energy representing for example a logic one or zero depending on whether the sources are connected to the resistors 32 or 34 or not. As indicated above, the variables A and B are chosen to be of a value to draw two units of current through resistor 32 any time variable A is present and to draw one unit of current through resistor 34 any time variable B is present.

Figure 4:
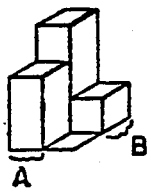
FIG. 4 is a chart showing different current unit biases which may be applied to the variable bias logic circuit of FIG. 3 and current volume diagrams, current maps, function maps and functions resulting from the different biases applied to the variable bias logic circuit of FIG. 3.
Figure 4:
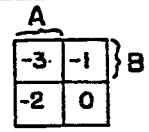
Figure 4:
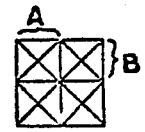
Figure 4:
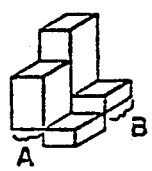
Figure 4:
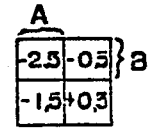
Figure 4:
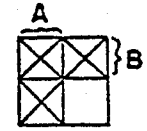
Figure 4:
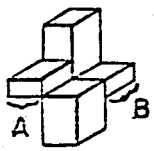
Figure 4:
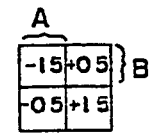
Figure 4:
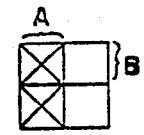
Figure 4:
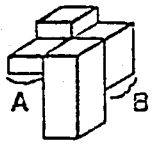
Figure 4:
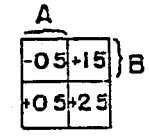
Figure 4:
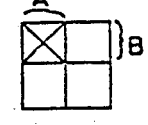

In operation of the variable bias logic circuit of FIG. 3, with a bias from some minus value to zero current units, as shown in FIG. 4, an output is provided over the conductor 18 from the transistor 12 which may, for example, be a signal representative of a logic one and which may in reality be zero volts. The output on the conductor 18 at this time is due to the fact that the transistor 12 is always turned on to place conductor 18 substantially at ground.

In such operation bias current is supplied to junction 36 from electronic common 22 through emitter 20 and base 28 of the transistor 12 to maintain the transistor in a conducting condition regardless of the presence or absence of logic variables A and B. The presence of the logic variables A and B at this time would only cause additional current to flow from electronic common 22 to junction 36.

A current volume diagram from current which may flow through the resistors 32 and 34 at this time is, as illustrated in FIG. 4, adjacent the minus one to zero bias indication, wherein the current which will flow through resistor 32 from junction 36 with variable A present is indicated as two units and the current through resistor 34 due to variable A being present is indicated as one unit. The maximum current drain is indicated as three units which would be the current drain when both variables A and B are present.

It will be noted that in accordance with the current map shown adjacent the current volume diagram that when neither variable A or B is present no current is drawn from junction 36 with a zero unit bias. The transistor 12 is at this time unstable. That is to say, as soon as current is drawn from junction 36 by either the bias source or variables A and B, the transistor 12 will turn on. If additional positive bias is supplied without variables A or B present, the transistor 12 will be turned off harder.

As indicated in the function map of FIG. 4 to the right of the minus one to zero bias, the output function is ALWAYS for the bias of minus one to zero. That is to say then that with the circuit of FIG. 3 with the bias going from minus one or any minus value to zero on the transistor 12, the transistor will always draw current from electronic common 22 through the emitter 20 and the transistor 12 will be turned on.

However, now consider that the bias at the junction 36 through the variable bias resistor 30 is between zero and positive one unit of current. Now if neither the variable A nor the variable B is present so that no current is drawn through the resistors 32 and 34, there will always be a positive bias on the base 28 of the transistor 12 so that with neither variable A or B present the transistor 12 will always be turned off.

If however the variable B is present, for example and therefore one unit of current is drawn through resistor 34, it will be readily seen that any time the bias is between zero and plus one unit of current from the variable bias source, the one unit of current drawn through resistor 34 will draw all of the positive bias current plus some current from electronic common through the base 28 of the transistor 12 to again turn the transistor 12 on and provide an output therefrom on the conductor 18. Similarly if only the variable A is present so that only resistor 32 draws current, the difference between the bias current and the two units of current drawn through resistor 32 from junction 36 must be made up from electronic common 22 through the emitter 20 and the base 28 of the transistor 12, whereby the transistor 12 is again turned on. Obviously therefore if both variables A and B are present so that resistors 32 and 34 require three units of current from junction 36 and only zero to one unit is supplied from the bias source, the transistor 12 is again turned on.

In this regard it is well to keep in mind Kirkoffs law which states simply that the current into a junction must equal the current out of a junction. Thus any time the presence of the variables A and B require more current from the junction 36 than is supplied by the bias source, the additional current will be made up from electronic common through the emitter and base of transistor 12 and the transistor 12 will be turned on.

Accordingly a function map, as illustrated at the far right from the zero to one bias indication in FIG. 4, may be drawn which is a function map for a simple OR circuit. That is to say, with a bias source supplying from zero to one current units at the junction 36 of the variable bias logic circuit 10, if either variable A or B is present, the circuit 10 will provide a zero voltage on conductor 18.

From a tolerance point of view, the best value for bias is ½. The gain of the transistor 12 must then be such that conductor 18 is indeed returned to ground with ½ unit current out the base of the transistor. If the bias is ¾, the gain of the transistor 12 must be such that with ¼ unit current out the base conductor 18 is returned to ground. Thus the transistor gain must be twice as much in the second case than in the first case.

Again the current volume diagram and current map for the variable bias logic circuit 10 corresponding to, for example a one-half current unit bias level, are illustrated to the right of the zero to one bias indication of FIG. 4. It will be seen that varying the bias applied to the variable logic circuit 10 from zero to one unit is similar to passing a plane through the current volume diagram at the half unit current level. Further the logic function on such plane passed through the current volume diagram will be in accordance with the positive bias found in the current map to provide the simple OR logic function with respect to the variables A and B, as indicated.

Raising the bias to provide between one and two units of positive current will in the same manner provide the current volume diagram, current map and function map to provide the function A indicated to the right of the bias indication positive one to positive two of FIG. 4. Thus specifically when the bias provides one and one-half units of current, the variable bias logic circuit 10 will provide an only A function; that is there will be a zero volt output on the conductor 18 only when the variable A is present and two units of current are drawn through the resistor 32. At this bias level the presence or absence of the variable B will have no effect on the operation of the circuit 10.

Raising the bias to supply between two and three units of current at the junction 36 will provide a zero volt output on the conductor 18 only when both the variables A and B are present so that current is drawn through both resistors 32 and 34 from the junction 36. The current volume diagram, current map and function map for a bias of two and one-half current units supplied to the variable bias logic circuit of FIG. 3 from the bias source of electric energy is given opposite the bias indication of two to three units of current in FIG. 4 and provides the function A and B. In other words, there will only be a zero volt output on the conductor 18 when both the variables A and B are present.

It will thus be seen that in accordance with the invention there is provided a single logic circuit which is capable in accordance with the bias applied thereto of functioning in the manner of a plurality of previous distinct logic circuits. Specifically with a single circuit 10 it has been shown that the functions ALWAYS, A or B, A, and A and B can be implemented. Obviously it will also be possible to implement the function NEVER with a bias current supply greater than three units.

In addition, it will be noted that the usual AND, OR and NOT circuits are characterized by allowing input signal and/or component tolerances of up to plus or minus forty-nine percent (assuming one percent is still enough to switch the unit). The philosophy of the present invention is that components, manufacturing techniques, and signals in the present state-of-the-art are such that smaller tolerances are permissible. The larger the number of inputs, the greater the number of logical expressions which can be obtained by varying the bias. Also, the closer the tolerances required on the currents. For example, for inputs of 1, 2 and 4 units of current and a bias of ½ unit of current, the tolerance on the 4 unit leg is ½ divided by 4 or 12.5 percent. If a fourth leg is added which has a value of 8 units of current, the tolerance required is ½ divided by 8 or 6 percent. Thus, the ability to generate more complex expressions is at the expense of closer tolerance components and signals. The three input leg unit generates two to the third power which equals eight logical expressions. The four input leg unit generates two to the fourth power which equals sixteen logical expressions, and so on.

Further, it will be understood that the principles of the variable bias logic circuit 10 are not restricted to two variable logic functions. The circuit 10 can be modified to implement logic functions or statements including three, four and more variables. The variable bias logic circuit 38 for three variables is for example illustrated in FIG. 5.

Figure 5:
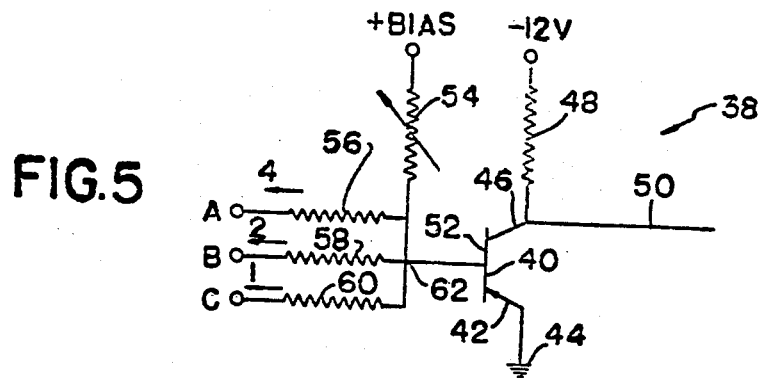
FIG. 5 is a schematic diagram of a three variable, variable bias logic circuit constructed in accordance with the invention.

Specifically in FIG. 5 the transistor 40 includes the emitter 42 connected to electronic common 44 and the collector 46 connected to a source of negative voltage, as shown, through resistor 48 across which resistor an output signal may be taken on the conductor 50. The base 52 of the transistor 40 is connected through the variable bias resistor 54 to the source of positive bias indicated and to variables A, B and C through the resistors 56, 58 and 60, respectively.

Again the variables A, B and C may be sources of electric energy representing logic zero or one depending on the level of the signal provided and the characteristics of the circuit 38 are so chosen that with a bias providing zero current units, the transistor 40 is at the threshold of conduction. The resistors 56, 58 and 60 are further so sized that one unit of current will flow through the resistor 60 when the variable C is present, two units of current will flow through the resistor 58 when the variable B is present and four units of current will flow through the resistor 56 when the variable A is present.

Thus, as the number of variables are increased, it will be seen that each additional resistance could pass current from junction 62 in response to the presence of the additional variable in accordance with the binary numbering system. Thus if a variable bias logic circuit has four variables, the additional resistor could pass eight units of current when the fourth variable is present. The invention is however not limited to such structure. In fact, as discussed above with such structure the 4 current leg would require a tolerance of ½ divided by 4 or 12.5 percent. If instead of 1, 2 and 4 units of current 1, 2 and 3 units of current were used with the bias given above, the function maps would indicate that there are only 6 distinct logical expressions available instead of the 7 shown in FIG. 6. The logical expression for A would not be available. If the units of current were chosen to be 1, 1 and 1 and a bias of +1.5 were used, we would get all the functions shown in FIG. 6 except A and in addition could implement the function A(B+C)+BC which is a function we did not have before. In addition, the tolerance requirement is less since ½ divided by 1 equals 50 percent. Thus various choices of current values for each leg of a variable bias logic circuit results in a different set of logical expressions obtainable from a single unit as the bias is varied. In addition various choices of current values for each leg results in a different tolerance requirement.

Also, it is possible for a leg to a negative power supply to serve as the variable bias. In this modification the unit would be connected with the variable leg to a source of negative voltage and a fixed leg to a source of positive voltage. The current and function maps for this choice of values would again provide implementation of logic functions, some of which are the same as those shown in FIG. 6 and some of which are different.

Specifically, with the circuit of FIG. 5 it will be evident that with the bias supplying between zero and one units of current that the transistor 40 will be turned on when any of the variables A or B or C are present; that is to say whenever there is current drain from the junction 62 of at least one unit of current. When the bias current supplied is less than one unit of current, the additional current required by the presence of any of the variables must come from electronic common 44 through emitter 42 and base 52 of transistor 40 to turn the transistor on. Thus with the bias between zero and one unit of current, the three variable logic circuit of FIG. 5 provides a three variable OR gate, that is it will provide an output if any of A or B or C are present. This operation is indicated by the current map, function map and logic function to the right of the zero to one bias indication in FIG. 6.

In a similar manner varying the bias to supply between one and two units of current will cause turning on of the transistor 40 only when A or B are present. Thus a two element OR gate may be implemented with the variable bias logic circuit 38, as shown to the right of the bias indication one to two in FIG. 6.

Figure 6:
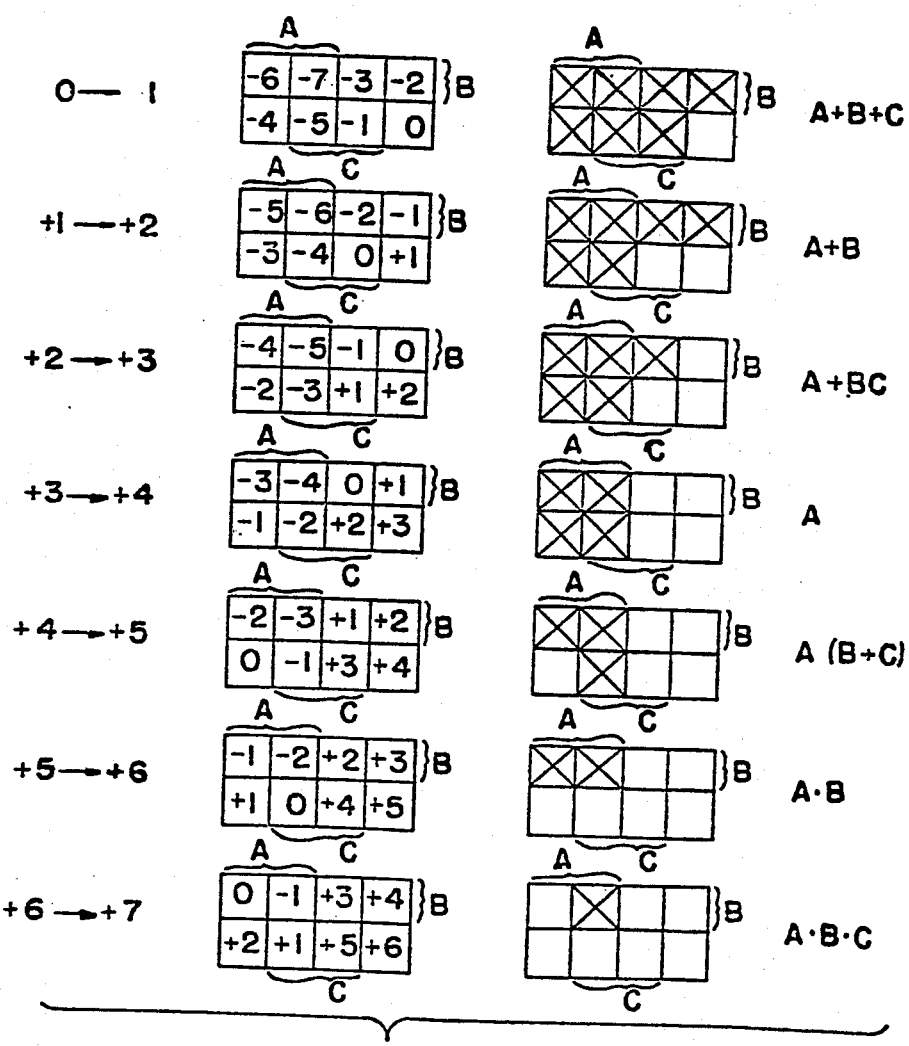
FIG. 6 is a chart showing different current unit biases which may be applied to the variable bias logic circuit of FIG. 5 and current maps, function maps and functions resulting from the different biases applied to the variable bias logic circuit of FIG. 5.

Again in a like manner it can be shown that by varying the bias on the variable bias logic circuit 38 of FIG. 5 to supply between two and three units of current between three and four units of current, four and five, five and six and six and seven units of current, that the current maps and function maps illustrated in FIG. 6 to the right of the respective bias indications are provided. In other words, by varying the bias on the circuit of FIG. 5 the additional logic functions A or B and C, A, A and B or A and C, A and B, and A and B and C may be implemented all with a single circuit 38.

It will be noted that each of the logic functions which may be implemented in a two variable system are repeated in a three variable system. Similarly the logic function which may be implemented in a three variable system are repeated in the logic functions which may be implemented in a four variable system.

There has thus been provided a single logic circuit which may be used to implement a plurality of logic functions. The necessity of producing or keeping a separate stock of different specific types of logic circuits, such as AND gates or OR gates is thus eliminated. Further since it is not usually necessary to use more than one transistor for a logic function, there is a time advantage in the variable bias logic circuits of the invention as well as considerable advantage in reduced fan-in and fan-out impedance problems associated with the usual implementation of other than very simple logic circuits.

If a logic function is particularly complex so that it is difficult to implement with a single variable bias logic circuit, a plurality of variable bias logic circuits may be combined to provide a desired function map as for example by combining two variable bias logic circuits together in an OR circuit or in an AND circuit.

Figure 7:
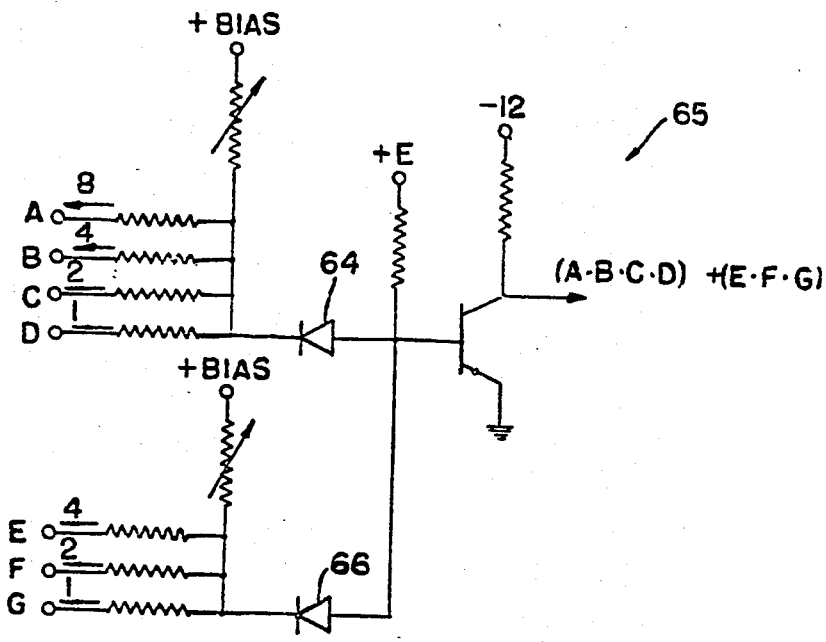
FIG. 7 is a schematic diagram of a three variable, variable bias logic circuit and a four variable, variable bias logic circuit combined in an OR circuit to implement complex logic functions.

Thus in FIG. 7 there is provided a variable bias logic circuit 65 for implementing the complex function A and B and C and D or E and F and G. The diodes 64 and 66 prevent inner-action between the two bias sources. The operation of the circuit of FIG. 7 is entirely analogous to the operation of the circuits 10 and 38 and will therefore not be considered in detail herein.

Figure 8:
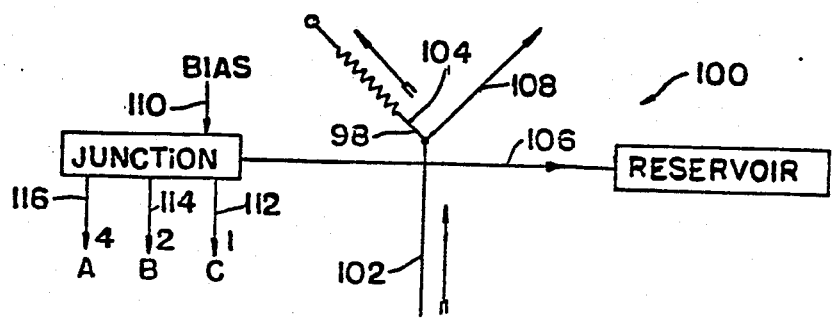
FIG. 8 is a diagrammatic representation of a fluid, variable bias logic circuit for three variables constructed in accordance with the invention.

Further it is not desired to restrict the variable bias logic circuits of the invention to a purely electronic implementation since other implementations are possible, such as for example, the fluid implementation 100 illustrated in FIG. 8. In FIG. 8 a fluid flip-flop 98 operating in accordance with the coanda effect is illustrated.

Fluid flip-flops based on the coanda effect are prevalent in the literature. A flip-flop is a bi-stable device. Fluid amplifiers can also become mono-stable devices by either building them non-symmetrical or by pre-biasing the inputs. A mono-stable device would be switched by the bias network drawing a continuous signal. A bi-stable device would be switched by the bias network drawing a pulse signal. The fluid circuit has the additional advantage that both the function F and not the function $\overline{F}$ is available at the output.

In fluid flip-flop 98 fluid coming through line 102 will normally flow through fluid line 104 when the bias in the fluid line 106 is in the direction indicated. However when the bias in the line 106 is in the opposite direction, the fluid in the line 102 will switch and be discharged through the fluid line 108.

Bias fluid is applied in the direction indicated through fluid line 110 and bias fluid is withdrawn through fluid lines 112, 114 and 116 in accordance with the presence of the variables A, B and C. The direction of flow of fluid in the line 106 will therefore depend on the amount of fluid input in the bias line 110 and the amount of fluid output from the lines 112, 114 and 116 which are again sized to provide fluid outflow in accordance with the functions it is desired to implement. Thus, with the binary number system which it will be noted is not essential when variable B is present, line 114 will pass twice the fluid that line 112 will pass when variable C is present, while with variable A present line 116 will pass twice the amount of fluid that line 114 will pass when variable B is present. Again the number of variables required is determined by the desired logic function.

The operation of the fluid, variable bias logic circuit 100 is exactly analogous to the operation of the electronic variable bias logic circuit 38. Thus as the volume of bias fluid input through line 110 is varied, the presence or absence of withdrawal of fluid through lines 112, 114 and 116 in accordance with the presence or absence of variables A, B and C will produce a fluid output from line 108 in accordance with the logic functions indicated in FIG. 6.

While one embodiment of the present invention and modifications thereof have been considered in detail, it will be understood that other embodiments and modifications are contemplated. For example, in the circuit of FIG. 8 pressure could vary the flow or the switching action could depend on momentum so that the quantity need not be volume. It is the intent to include all embodiments and modifications as are defined by the appended claims within the scope of the invention.

I claim:

1. A logic circuit comprising a switching device which will switch between first and second binary conditions in accordance with the level of an applied current, a plurality of inputs each adapted to receive a signal representing a different binary variable, a weighting means for each of said binary variables to provide a current level in accordance with the value of the corresponding binary variable providing one current level to represent one value and another current level to represent the other binary value, each of said weighting means providing a different current level magnitude to represent said one value than either of the current levels provided by each other weighting means and biasing means for providing a bias current level, said weighting means and said biasing means comprising summing means to add the current levels provided thereby together and apply the sum of said current levels to said switching device whereby the logic function of the logic circuit depends upon the current level provided by said biasing means.

2. A logic circuit as recited in claim 1, wherein said biasing means can be varied to provide a variable bias current level to said summing means, whereby the logic function of said logic circuit can be varied by varying the current provided by said biasing means.

3. A logic circuit as recited in claims 1 or 2, wherein said logic circuit has at least three inputs each adapted to receive a signal representing a different binary variable and a separate weighting means for each of said inputs, each of said weighting means providing a different current level magnitude to represent said one binary value than either of the current levels provided by each of the other weighting means.

4. A logic circuit as recited in claim 1, wherein the current level provided by said biasing means is selected so that said logic circuit produces the logic function $A+B$, wherein A and B represent binary variables applied to said inputs.

5. A logic circuit as recited in claim 1, wherein said biasing means provides a current level to said switching device to produce the logic function $A \cdot B$ wherein A and B represents the binary variables applied to said inputs.

6. A switching circuit as recited in claim 3, wherein said biasing means provides a current level to said switching device to produce the logic function $A+B+C$, wherein A, B and C represent the binary variables applied to said inputs.

7. A switching circuit as recited in claim 3, wherein said biasing means provides a current level to said switching device to produce the logic function $A+BC$, wherein A, B and C represent the binary variables applied to said inputs.

8. A switching circuit as recited in claim 3, wherein said biasing means provides a current level to said switching device to produce the logic function $A(B+C)$, wherein A, B and C represent the binary variables applied to said inputs.

9. A switching circuit as recited in claim 3, wherein said biasing means provides a current level to said switching device to produce the logic function $A \cdot B \cdot C$, wherein A, B and C represent the binary variables applied to said inputs.

10. A logic circuit as recited in claims 1 or 2, wherein the current levels provided by said weighting means to represent said other binary value is the same for all of said weighting means.

11. A switching circuit as recited in claims 1 or 2, wherein the polarity of the current level provided by said biasing means is opposite from current levels provided by said weighting means to represent said one value so that said bias current level is subtracted from the current levels to represent said one value by said summing means.

12. A logic circuit as recited in claims 1 or 2, wherein each of said weighting means comprises a resistance connected to the corresponding input and said biasing means comprises a resistance connected to a voltage source and wherein said summing means comprises a circuit connecting the opposite ends of said resistances from that connecting to said inputs and to the voltage source to a common junction and to a control input of said switching means.

13. A switching circuit as recited in claim 12, wherein said switching device comprises a transistor and the control of said transistor is the base electrode of said transistor.

* * * * *